(12) United States Patent
Nakajima et al.

(10) Patent No.: US 10,128,829 B2
(45) Date of Patent: Nov. 13, 2018

(54) COMPOSITE SEMICONDUCTOR DEVICE

(71) Applicant: SHARP KABUSHIKI KAISHA, Sakai, Osaka (JP)

(72) Inventors: Akio Nakajima, Sakai (JP); Hisao Ichijoh, Kyotanabe (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/564,138

(22) PCT Filed: Feb. 22, 2016

(86) PCT No.: PCT/JP2016/055085
§ 371 (c)(1),
(2) Date: Oct. 3, 2017

(87) PCT Pub. No.: WO2016/185745
PCT Pub. Date: Nov. 24, 2016

(65) Prior Publication Data
US 2018/0083613 A1  Mar. 22, 2018

(30) Foreign Application Priority Data
May 15, 2015 (JP) .................. 2015-100530

(51) Int. Cl.
*H03K 17/082* (2006.01)
*H01L 21/822* (2006.01)
(Continued)

(52) U.S. Cl.
CPC ......... *H03K 17/082* (2013.01); *H01L 21/822* (2013.01); *H01L 23/3114* (2013.01);
(Continued)

(58) Field of Classification Search
CPC .................................................. H03K 17/082
See application file for complete search history.

(56) References Cited

U.S. PATENT DOCUMENTS 6,535,050 B2 *  3/2003  Baudelot ............... H03F 1/223
   327/430
6,633,195 B2 * 10/2003  Baudelot ............... H01L 27/098
   257/E27.069
(Continued)

FOREIGN PATENT DOCUMENTS

| JP | 2006-158185 A | 6/2006 |
| JP | 2006-324839 A | 11/2006 |
| JP | 2010-522432 A | 7/2010 |

*Primary Examiner* — Jeffery S Zweizig
(74) *Attorney, Agent, or Firm* — Birch, Stewart, Kolasch & Birch, LLP

(57) ABSTRACT

Provided is a composite semiconductor device that has a low on-resistance and a high load-short-circuit resistance. In a composite semiconductor device (10) including a normally-on first FET (Q1) and a normally-off second FET (Q2) that are cascode-connected to each other. In a case where a voltage applied to a drain of the first FET (Q1) is 400 V, a relation of the following expression is satisfied:

[Math. 1]

$$\frac{RonQ2}{|VTHQ1|} + \frac{1}{Idmax1} \geq \frac{1}{Idmax},$$

where a time elapsed after short circuit T represents a time elapsed after a time at which a load connected to the composite semiconductor device (10) starts to be short-circuited, RonQ2 represents a value of an on-resistance of the second FET, VTHQ1 represents a threshold voltage of the first FET, Idmax1 represents a drain current of the first FET in a saturated state of the first FET when a gate voltage of the first FET is 0 V, and Idmax represents a drain current (Continued)

limited to an extent that breakdown of the first FET is prevented for the time elapsed after short circuit T of at least 2 μsec.

5 Claims, 7 Drawing Sheets

(51) Int. Cl.
    *H01L 27/04* (2006.01)
    *H03K 19/003* (2006.01)
    *H01L 23/31* (2006.01)
    *H01L 23/495* (2006.01)
    *H01L 23/00* (2006.01)
    *H03K 17/10* (2006.01)
    *H03K 17/567* (2006.01)
    *H02M 7/00* (2006.01)
    *H03K 17/687* (2006.01)

(52) U.S. Cl.
    CPC .. *H01L 23/49503* (2013.01); *H01L 23/49562* (2013.01); *H01L 23/49575* (2013.01); *H01L 24/40* (2013.01); *H01L 27/04* (2013.01); *H03K 17/0828* (2013.01); *H03K 17/107* (2013.01); *H03K 17/567* (2013.01); *H03K 19/003* (2013.01); *H01L 2224/40137* (2013.01); *H01L 2224/40245* (2013.01); *H01L 2924/00014* (2013.01); *H01L 2924/1033* (2013.01); *H01L 2924/10253* (2013.01); *H01L 2924/13062* (2013.01); *H01L 2924/13064* (2013.01); *H02M 7/003* (2013.01); *H03K 2017/6875* (2013.01)

(56) References Cited

U.S. PATENT DOCUMENTS

| | | | |
|---|---|---|---|
| 7,501,670 B2* | 3/2009 | Murphy | H01L 27/0605 257/194 |
| 8,487,667 B2* | 7/2013 | Iwamura | H03K 17/567 327/108 |
| 2008/0230784 A1 | 9/2008 | Murphy | |

\* cited by examiner

| Tp [μs] | CASCODE Idmax [A] | GaN Idmax1 [A] | \|RonQ2/VTHQ1\| ≧ A  A |
|---|---|---|---|
| 2 | 300 | 250 | --- |
|   |     | 300 | --- |
|   |     | 350 | 1/2100 |
| 3 | 230 | 250 | 1/2875 |
|   |     | 300 | 7/6900 |
|   |     | 350 | 6/4025 |
| 5 | 180 | 250 | 7/4500 |
|   |     | 300 | 1/450 |
|   |     | 350 | 17/6300 |

FIG. 7

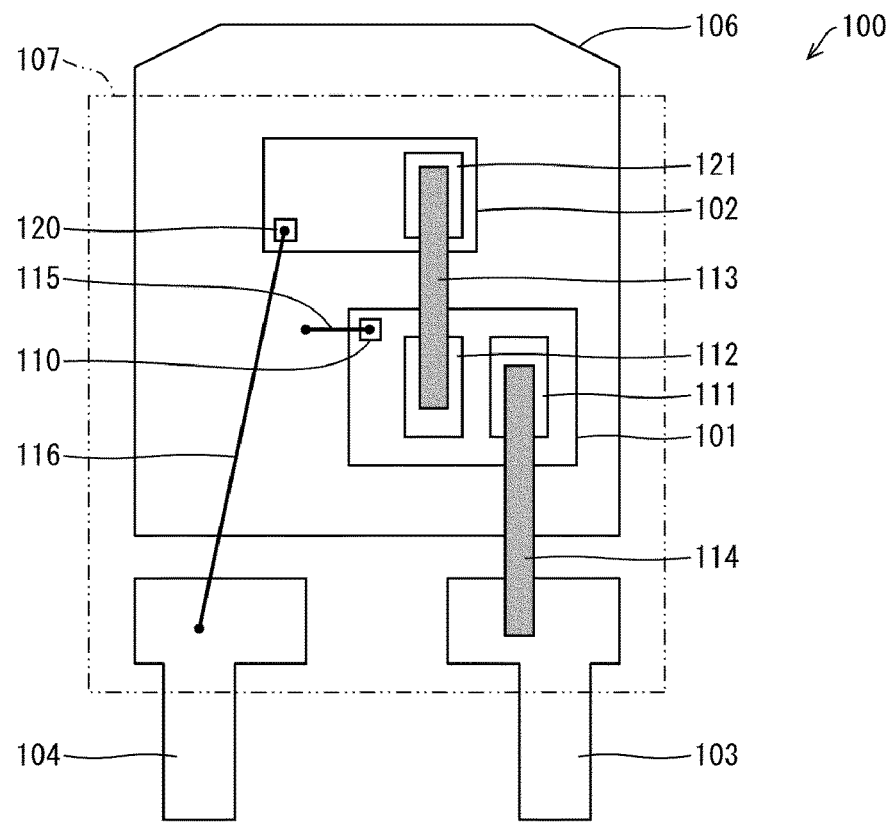

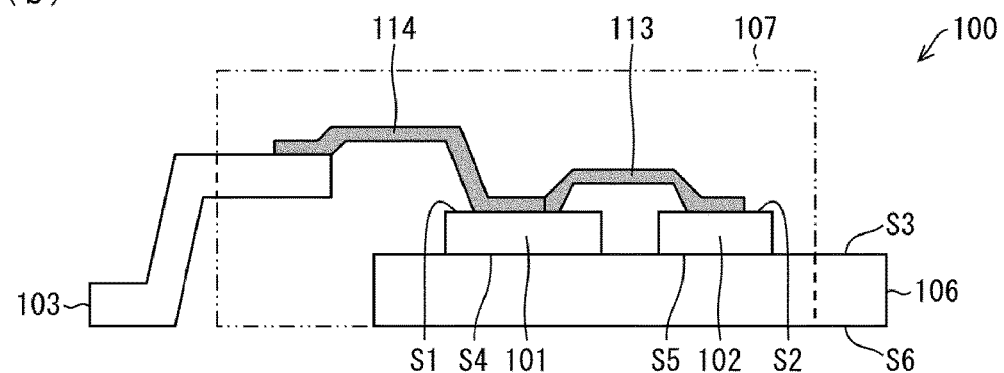

| | |
|---|---|
| 100: COMPOSITE SEMICONDUCTOR DEVICE | 110, 120: GATE ELECTRODE |
| 101: NORMALLY-ON FIELD EFFECT TRANSISTOR | 111, 121: DRAIN ELECTRODE |
| 102: NORMALLY-OFF FIELD EFFECT TRANSISTOR | 112 : SOURCE ELECTRODE |
| 103: FIRST TERMINAL (DRAIN TERMINAL) | 113, 114: ELECTRIC CONDUCTOR |
| 104: SECOND TERMINAL (GATE TERMINAL) | 115, 116: ELECTRICALLY-CONDUCTIVE MEMBER |
| 106: DIE PAD (SOURCE TERMINAL) | S1, S2, S3: FIRST MAIN SURFACE |
| 107: SEALING MEMBER | S4, S5, S6: SECOND MAIN SURFACE |

COMPOSITE SEMICONDUCTOR DEVICE

TECHNICAL FIELD

The present invention relates to a composite semiconductor device.

BACKGROUND ART

Conventionally, a Si (silicon)-based normally-off FET (Si-FET) is mainly used for a semiconductor device. The normally-off FET is a transistor that is made conductive between the drain and the source when a gate voltage is applied between the gate and the source and made non-conductive between the drain and the source when a gate voltage is not applied between the gate and the source.

On the other hand, the Si-FET has been approaching its limitation in terms of physical performance. Among wide gap semiconductor FETs that are expected to have performance exceeding that of the Si-FET, an HFET (hetero FET) using two-dimensional electron gas, such as a GaN semiconductor FET (also referred to as a GaN-FET) is attracting attention. The GaN-FET is able to relatively easily achieve a high withstand voltage, a high-temperature operation, and a low on-resistance by heterojunction and thus is highly useful. However, the GaN-FET is typically a normally-on FET and is difficult to be used as a normally-off FET.

The normally-on FET is switched on even when a gate voltage is 0 V (volt). A normally-off operation is strongly requested as a power device in terms of safety. Thus, a composite semiconductor device having a cascode configuration in which a normally-on FET and a normally-off FET are connected in series to thereby realize a normally-off semiconductor switch as a whole of the device has been proposed. In the cascode configuration, since a mirror effect is suppressed as widely known, a high-speed operation of the normally-on FET is not impaired.

PTL 1 discloses a composite semiconductor device having a cascode configuration in which a normally-on switching element and a normally-off switching element are connected in series. Voltage clamping means is provided as a protection circuit between the drain (or the collector) and the gate (or the base) of the normally-off switching element.

PTL 2 discloses a composite semiconductor device having a cascode configuration in which a normally-on power semiconductor switching element constituted by a wide gap semiconductor and a plurality of normally-off metal insulating film semiconductor field effect transistors are connected in series. A high-speed diode that is connected in parallel with such cascode elements is provided and a switching loss caused by a reverse recovery current is reduced.

PTL 3 discloses a composite semiconductor device having a cascode configuration in which each of the normally-on GaN semiconductors FET that are manufactured in various configurations and a normally-off FET are connected in series.

CITATION LIST

Patent Literature

PTL 1: Japanese Unexamined Patent Application Publication No. 2006-324839 (published on Nov. 30, 2006)
PTL 2: Japanese Unexamined Patent Application Publication No. 2006-158185 (published on Jun. 15, 2006)
PTL 3: Japanese Translation of PCT Application No. 2010-522432 (published on Jul. 1, 2010)

SUMMARY OF INVENTION

Technical Problem

In each of the composite semiconductor devices disclosed in PTLs 1 to 3, however, there is no sufficient resistance to short circuit of a load (hereinafter, also referred to as "load short circuit") connected to the composite semiconductor device, which is a problem. When the load short circuit occurs, overcurrent flows through the composite semiconductor device and the composite semiconductor device may be broken due to the overcurrent.

That is, in a power supply circuit or an inverter circuit including the composite semiconductor device, a load short circuit state may be caused by an excessive load, an erroneous operation, or the like. When a normally-off FET is able to be rapidly cut off in a case of the overcurrent being detected by using a shunt resistance or the like, the breakdown of the composite semiconductor device due to the load short circuit is able to be prevented. When overcurrent detection speed (response speed of a circuit that detects the overcurrent) excessively increases, however, probability of erroneous detection becomes high due to influence of switching noise or the like and an erroneous operation of an entire system is likely to be caused, and therefore it is difficult to excessively increase the overcurrent detection speed.

Thus, even a composite semiconductor device having a cascode configuration is practically required to resist the load short circuit for a certain time.

The invention was made in view of the aforementioned problems of the related art and an object thereof is to provide a composite semiconductor device that has a low on-resistance and a high resistance to load short circuit.

Solution to Problem

For solving the aforementioned problems, a composite semiconductor device according to an aspect of the invention is a composite semiconductor device including a normally-on first FET and a normally-off second FET that are cascode-connected to each other. In a case where a voltage applied to a drain of the first FET is 400 V, a relation of a following expression is satisfied:

[Math. 1]

$$\frac{RonQ2}{|VTHQ1|} + \frac{1}{Id\max 1} \geq \frac{1}{Id\max},$$

where a time elapsed after short circuit T represents a time elapsed after a time at which a load connected to the composite semiconductor device starts to be short-circuited, RonQ2 represents a value of an on-resistance of the second FET, VTHQ1 represents a threshold voltage of the first FET, Idmax1 represents a drain current of the first FET in a saturated state of the first FET when a gate voltage of the first FET is 0 V, and Idmax represents a drain current limited to an extent that breakdown of the first FET is prevented for the time elapsed after short circuit T of at least 2 μsec.

Advantageous Effects of Invention

According to the invention, an effect of providing a composite semiconductor device that has a low on-resistance and high load-short-circuit resistance.

BRIEF DESCRIPTION OF DRAWINGS

FIG. 7(a) is a top view illustrating a specific configuration of a composite semiconductor device according to Embodiment 2 of the invention and FIG. 7(b) is a side view thereof.

DESCRIPTION OF EMBODIMENTS

Embodiment 1

An embodiment of the invention will be described below with reference to FIGS. 1 to 6.

In the present embodiment, first, a circuit configuration of a cascode device, which includes a GaN-FET (first FET) Q1 and a Si-FET (second FET) Q2, as a composite semiconductor device (composite switching element) will be described. Next, typical Vds-Id characteristics of the GaN-FET Q1 will be described. Further, characteristics of a current flowing through the GaN-FET Q1 in the composite semiconductor device will be described, and then, an action of limiting a drain current flowing through the composite semiconductor device when a load connected to the composite semiconductor device is short-circuited will be described.

Note that, in any FET, a gate voltage indicates a gate potential with respect to a source potential of the FET in the description below. In any FET, an ON state indicates a conductive state between a drain and a source of the FET and an OFF state indicates a cut-off state between the drain and the source of the FET.

<Circuit Configuration of Composite Semiconductor Device 10>

Figure 1:
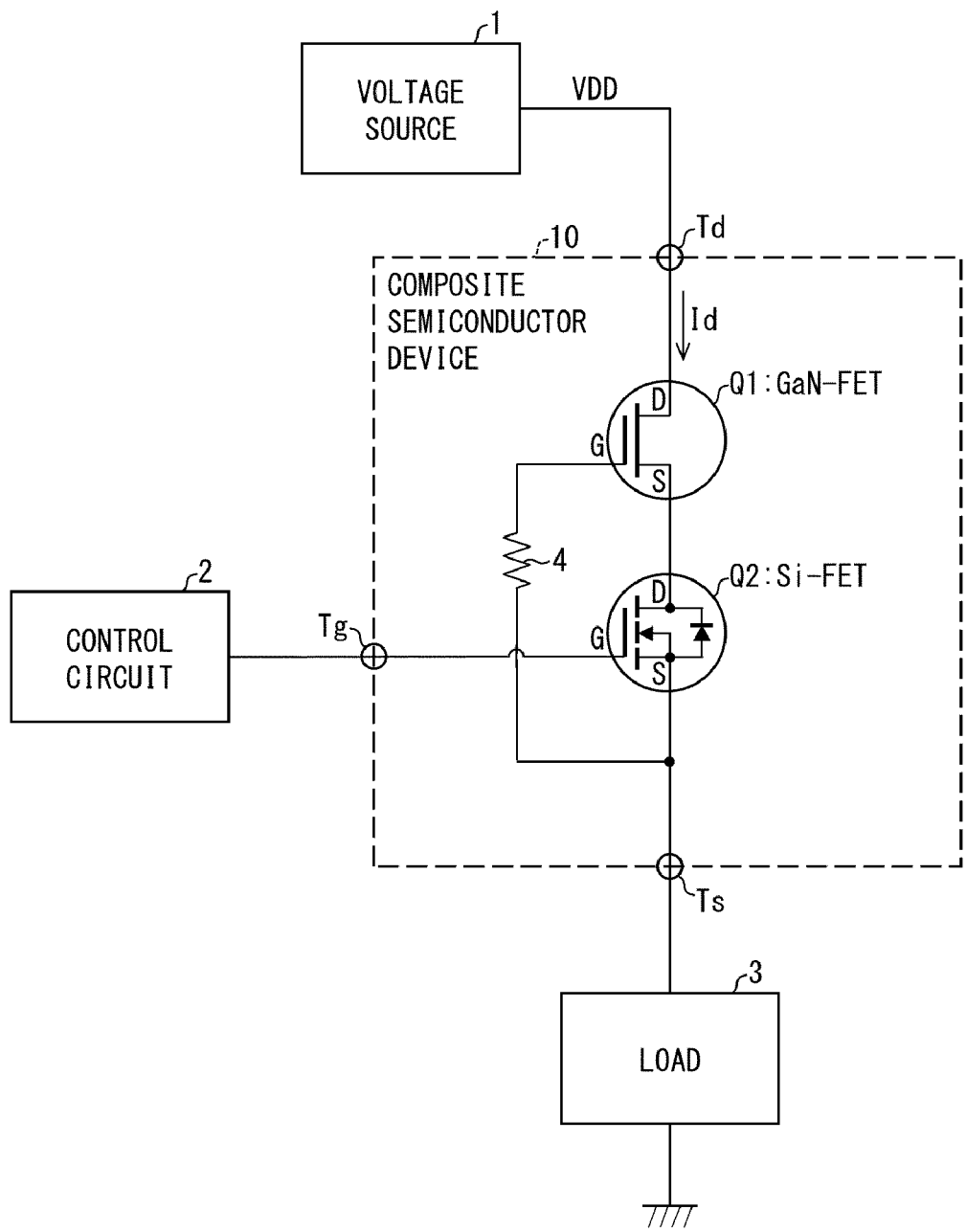
FIG. 1 is a circuit diagram illustrating a specific configuration of a composite semiconductor device according to Embodiment 1 of the invention and a peripheral configuration of the composite semiconductor device.

A configuration of a composite semiconductor device 10 of the present embodiment will be described with reference to FIG. 1. FIG. 1 is a circuit diagram illustrating a specific configuration of the composite semiconductor device 10 according to the present Embodiment 1 and a peripheral configuration of the composite semiconductor device 10.

The composite semiconductor device 10 of the present embodiment includes the GaN-FET Q1 and the Si-FET Q2 that are connected in series to each other, a drain terminal Td that is connected to a drain of the GaN-FET Q1, a source terminal Ts that is connected to a source of the Si-FET Q2, a gate terminal Tg that is connected to a gate of the Si-FET Q2, and a resistance 4. Both the GaN-FET Q1 and the Si-FET Q2 are N-channel FETs.

As the peripheral configuration of the composite semiconductor device 10, a voltage source 1 is connected to the drain terminal Td, a control circuit 2 is connected to the gate terminal Tg, a load 3 is connected to the source terminal Ts, and the load 3 is grounded.

The specific configuration of the composite semiconductor device 10 is as follows.

The drain terminal Td is connected to the drain of the GaN-FET Q1 and a source of the GaN-FET Q1 is connected to a drain of the Si-FET Q2. The gate of the Si-FET Q2 is connected to the gate terminal Tg. The source of the Si-FET Q2 is connected to the source terminal Ts and connected to one end of the resistance 4. The other end of the resistance 4 is connected to a gate of the GaN-FET Q1. That is, the source of the Si-FET Q2 is connected to the gate of the GaN-FET Q1 via the resistance 4. In this case, the source of the Si-FET Q2 and the gate of the GaN-FET Q1 may be directly connected without the resistance 4 therebetween.

As described above, the GaN-FET Q1 and the Si-FET Q2 are cascode-connected to each other (connected in a cascode configuration). That is, the composite semiconductor device 10 has a configuration in which the GaN-FET Q1 as the gate grounded FET is stacked on the Si-FET Q2 as the source grounded FET.

The GaN-FET Q1 includes a group III nitride semiconductor (compound semiconductor) represented by GaN (Gallium Nitride), AlGaN, InGaN, and the like, and is, for example, a GaNFET, that is, a normally-on FET formed of a GaN semiconductor. The normally-on FET is in the ON state even when the gate voltage is 0 V (volt). Thus, the GaN-FET Q1 is brought into the ON state when the gate voltage to the GaN-FET Q1 is zero or equal to or higher than a predetermined threshold voltage VTHQ1 having a negative voltage value, and is brought into the OFF state when the gate voltage is lower than the threshold voltage VTHQ1.

The Si-FET Q2 is a SiMOSFET (Si-Metal Oxide Semiconductor Field Effect Transistor), that is, an insulated gate FET formed of a silicon semiconductor, and is a normally-off FET. In this case, the Si-FET Q2 may be constituted by a Schottky gate FET. As the Si-FET Q2, a suitable FET may be selected as appropriate in accordance with characteristics required for the composite semiconductor device 10, and as a result, less limitation is imposed on a design of the composite semiconductor device 10. The normally-off FET is in the OFF state when the gate voltage is 0 V (volt). That is, similarly to the GaN-FET Q1, the Si-FET Q2 is brought into the ON state when the gate voltage to the Si-FET Q2 is equal to or higher than a threshold voltage VTHQ2, and is brought into the OFF state when the gate voltage is lower than the threshold voltage VTHQ2. In this case, the threshold voltage VTHQ2 has a positive voltage value. Note that, a parasitic diode whose forward direction is a direction from a source to a drain is incorporated in the Si-FET Q2.

The voltage source 1 applies, to the drain terminal Td, a direct-current power supply voltage VDD relative to the ground (VDD>0).

The control circuit 2 supplies a gate voltage VgsQ2 to the Si-FET Q2 via the gate terminal Tg and controls the gate voltage VgsQ2 of the Si-FET Q2. Thereby, the control circuit 2 controls the ON state and the OFF state of the Si-FET Q2.

When the Si-FET Q2 is in the ON state, a current flows from the drain terminal Td to the source terminal Ts in the composite semiconductor device 10. At this time, since a voltage drop in the Si-FET Q2 is approximately 0 V (volt), a gate voltage VgsQ1 that is applied to the normally-on GaN-FET Q1 as a reverse voltage is also approximately 0 V. Thus, the GaN-FET Q1 keeps the ON state.

On the other hand, when the gate voltage VgsQ2 supplied from the control circuit 2 to the Si-FET Q2 is equal to or lower than the threshold voltage VTHQ2 and the Si-FET Q2 is in the OFF state, a drain potential of the Si-FET Q2 rises. Thus, a drain-source voltage VdsQ2 of the Si-FET Q2 increases. The drain-source voltage VdsQ2 of the Si-FET Q2 is applied as a reverse voltage to the gate voltage VgsQ1 of the GaN-FET Q1. Thereby, the gate voltage VgsQ1 of the GaN-FET Q1 is lower than the threshold voltage VTHQ1, and then the GaN-FET Q1 is brought into the OFF state.

Consequently, in the composite semiconductor device 10 that functions as one switching element, the state is ON (in the conductive state) between the drain terminal Td and the source terminal Ts when the Si-FET Q2 is in the ON state, and the state is OFF (in the cut-off state) when the Si-FET Q2 is in the OFF state. That is, the composite semiconductor device 10 realizes an operation of one normally-off FET as the entire device.

In the composite semiconductor device 10, a current flowing from the drain terminal Td to the source terminal Ts is set as a drain current Id. The drain current Id corresponds to a drain current when the composite semiconductor device 10 is regarded as one normally-off FET and matches a drain current of the GaN-FET Q1 and a drain current of the FET Q2.

The drain current Id is supplied to the load 3 via the source terminal Ts and flows into the ground. The load 3 may be of any type, and when an inverter circuit is formed by using the composite semiconductor device 10, an arm of the inverter circuit can be included in the load 3.

Though the control circuit 2 is also able to perform switching control for alternately switching the ON state and the OFF state of the Si-FET Q2, unless otherwise noted, a state where the gate voltage for causing the Si-FET Q2 to be in the ON state is supplied to the Si-FET Q2 is considered in the description below.

<Vds-Id Characteristics of GaN-FET Q1>

Figure 2:
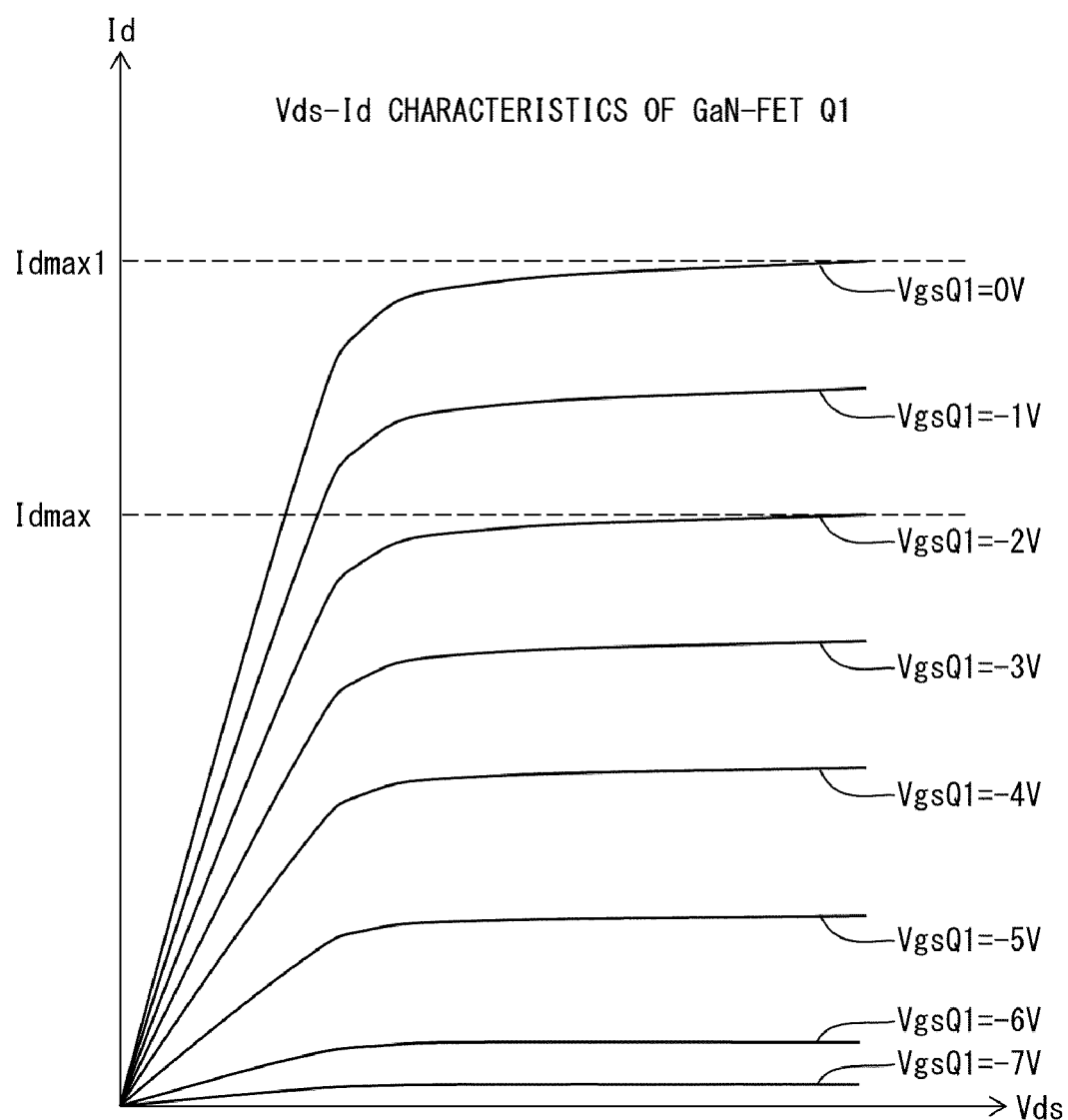
FIG. 2 illustrates Vds-Id characteristics at each Vgs of a GaN-FET in the composite semiconductor device.

Here, Vds-Id characteristics at each of the gate voltages VgsQ1 of the normally-on GaN-FET Q1 included in the composite semiconductor device 10 of the present embodiment will be described with reference to FIG. 2. FIG. 2 illustrates Vds-Id characteristics at each of the gate voltages VgsQ1 of the GaN-FET Q1 in the composite semiconductor device 10. Here, Vds means a drain-source voltage and Id means a drain current.

As illustrated in FIG. 2, the drain current Id flowing through the GaN-FET Q1 increases as the drain-source voltage VdsQ1 of the GaN-FET Q1 increases from 0 V to a certain value, and when the drain-source voltage VdsQ1 exceeds the certain value, the GaN-FET Q1 is saturated, and the current value hardly increases. A state where any FET is saturated is hereinafter referred to as a saturated state.

The drain current Id flowing through the GaN-FET Q1 increases as a difference between the threshold voltage VTHQ1 and the gate voltage VgsQ1 in the GaN-FET Q1 is greater. Thus, it is found that, as illustrated in FIG. 2, when the gate voltage VgsQ1 increases from −7 V to 0 V, the drain current Id increases and the drain current Id flowing through the GaN-FET Q1 in the saturated state also increases accordingly.

In FIG. 2, the drain current Id in the saturated state when the gate voltage VgsQ1 of the GaN-FET Q1 is 0 V is set as Idmax1. Note that, in the present specification, the Idmax1 is also referred to as a maximum drain current at the overcurrent in the description below.

<Current Characteristics of Composite Semiconductor Device 10>

Characteristics of the current flowing through the GaN-FET Q1 in the composite semiconductor device 10 of the present embodiment will be described. The drain current Id flowing through the GaN-FET Q1, when the composite semiconductor device 10 is in the ON state, the power supply voltage VDD is fixed, and the drain current Id flows from the drain terminal Td to the source terminal Ts, is generally represented by the following mathematical expression (1).

$$Id = gm(VgsQ1 - VTHQ1) \quad (1)$$

In the expression, gm indicates a transconductance. The threshold voltage VTHQ1 of the normally-on GaN-FET Q1 has a negative value. Here, the gate voltage VgsQ1 applied to the GaN-FET Q1 is a reverse voltage of a potential difference between the drain and the source of the Si-FET Q2 as described above and is thus represented by the following mathematical expression (2).

$$VgsQ1 = -RonQ2 * Id \quad (2)$$

When the mathematical expression (2) is substituted into the mathematical expression (1), the following mathematical expression (3) is derived. In this case, VTHQ1 has a negative value and is represented by an absolute value.

$$Id = gm(-RonQ2*Id + |VTHQ1|)$$

$$\leftrightarrow Id(1+gm*RonQ2) = gm*|VTHQ1|$$

$$\leftrightarrow Id = gm*|VTHQ1|/(1+gm*RonQ2) \quad (3)$$

According to the mathematical expression (3) above, it is found that the drain current Id flowing through the GaN-FET Q1 decreases as RonQ2 increases or as the absolute value of the threshold voltage VTHQ1 decreases.

<Action of Limiting Drain Current Id when Load 3 is Short-Circuited>

Figure 3:
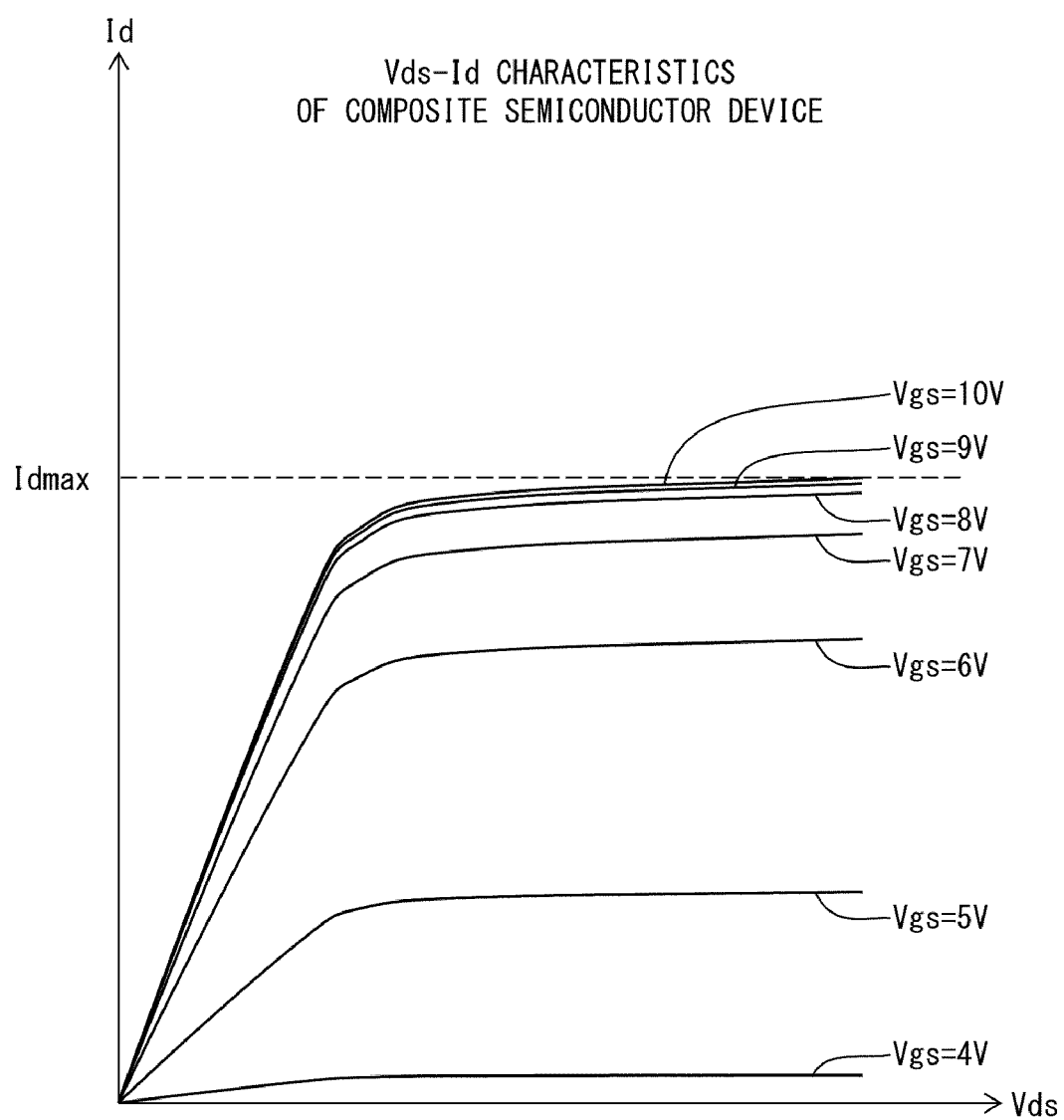
FIG. 3 is a graph indicating Vds-Id characteristics at each Vgs of the composite semiconductor device.

The action of limiting the drain current Id flowing through the composite semiconductor device 10 when the load 3 connected to the composite semiconductor device 10 is short-circuited will be described below with reference to FIGS. 2 to 6. FIG. 3 is a graph indicating Vds-Id characteristics at each of the gate voltages Vgs of the composite semiconductor device 10.

In a case where the Si-FET Q2 has the on-resistance RonQ2≈0Ω (VgsQ1≈0 V) in the composite semiconductor device 10, when the load 3 is short-circuited, the GaN-FET Q1 is in the saturated state as illustrated in FIG. 2 and a maximum drain current Idmax1 at the overcurrent flows through the GaN-FET Q1 as the drain current Id. Hereinafter, the load 3 being short-circuited (that is, the source terminal Ts having the ground potential of 0 V) is expressed as "load short circuit". The load short circuit is one of the factors that cause the overcurrent of the drain current Id.

The control circuit 2 is able to detect a current value of the drain current Id by using a shunt resistor (not illustrated) or a pulse transformer (not illustrated) connected in series in a path through which the drain current Id flows and to perform processing for dealing with the overcurrent on the basis of the detected current value.

In the processing for dealing with the overcurrent, when the detected current value is equal to or greater than a predetermined overcurrent determination threshold $I_{LIM}$, the control circuit 2 determines that the overcurrent is generated in the composite semiconductor device 10 and cuts off the path through which the drain current Id flows. The cutting-off is realized by causing the Si-FET Q2 to be in the OFF state or turning off a switch (a semiconductor switching element other than the Si-FET Q2 or a mechanical relay) connected in series in the path through which the drain current Id flows.

When speed for detecting whether or not the overcurrent is generated (response speed of the circuit that detects the overcurrent) excessively increases, probability of erroneous detection becomes high due to influence of switching noise or the like and an erroneous operation of an entire system may be caused. Thus, the control circuit 2 is formed so that the occurrence of the overcurrent is detected at a time after the elapse of a predetermined response time for detecting the overcurrent after the current value of the drain current Id is actually equal to or greater than the overcurrent determination threshold $I_{LIM}$. Therefore, time of several μsec is generally required as a time until the control circuit 2 cuts off the path through which the drain current Id flows after the drain current Id becomes the overcurrent due to the load short circuit. That is, the composite semiconductor device 10 having the cascode configuration is practically required to resist the load short circuit for a certain time.

Thus, the drain current Id flowing through the composite semiconductor device when the load short circuit occurs needs to be limited to the maximum drain current Idmax that the GaN-FET Q1 can resist the load short circuit without breakdown until the control circuit 2 cuts off the path through which the drain current Id flows, that is, for a certain time.

When the drain current Id of the GaN-FET Q1 reaches, due to the load short circuit, for example, the maximum drain current Idmax1 at the overcurrent, the GaN-FET Q1 of the composite semiconductor device 10 may be broken immediately. Thus, the composite semiconductor device 10 needs to resist the load short circuit for a certain time without breakdown. For example, as a general request of a resistance to short circuit when a load on an output side is short-circuited in a device like the composite semiconductor device 10, the composite semiconductor device 10 is required to resist the load short circuit without breakdown for at least 2 μsec, preferably, 5 μsec even when a voltage of Vds=400 V is applied as the drain-source voltage Vds. Such a resistance to short circuit when the load short circuit occurs is generally not intended as a specification in a high-speed switching device.

Then, the composite semiconductor device 10 of the present embodiment limits the drain current Id flowing through the GaN-FET Q1, when the load short circuit occurs, to the maximum drain current Idmax that prevents breakdown of the GaN-FET Q1 for a certain time by setting the on-resistance RonQ2 of the Si-FET Q2 and the absolute value of the threshold voltage VTHQ1 of the GaN-FET Q1 to satisfy a relation described below.

In other words, a value of the on-resistance (on-resistance RonQ2 described below) of the Si-FET Q2 or the threshold voltage VTHQ1 of the GaN-FET Q1 is set so that the drain current Id of the GaN-FET Q1 is limited to the maximum drain current Idmax in a degree of preventing breakdown of the GaN-FET Q1 caused by the short circuit of the load 3 connected to the composite semiconductor device 10 for a certain time.

Hereinafter, first, (i) limitation of the maximum drain current Idmax by increasing RonQ2 and (ii) limitation of the maximum drain current Idmax by decreasing the absolute value of the threshold voltage VTHQ1 of the GaN-FET Q1 will be described. Then, (iii) a relation satisfied by the on-resistance RonQ2 of the Si-FET Q2 and the absolute value of the threshold voltage VTHQ1 of the GaN-FET Q1 will be described.

(i) About limitation of maximum drain current Idmax by increasing RonQ2

Since the conventional Si-FET Q2 has the on-resistance RonQ2≈0Ω when the load short circuit occurs, a voltage drop in the Si-FET Q2 is approximately 0 V (volt) and the gate voltage VgsQ1 that is applied to the GaN-FET Q1 is also approximately 0 V. Thus, when the load short circuit occurs, the maximum drain current Idmax1 at the overcurrent flows through the GaN-FET Q1.

On the other hand, since the Si-FET Q2 according to the present embodiment has the on-resistance RonQ2≉Ω, VdsQ2=RonQ2×Idmax is provided. In this case, the gate voltage VgsQ1 applied to the GaN-FET Q1 as the reverse voltage satisfies VgsQ1=−VdsQ2=−RonQ2×Idmax<0. Thereby, for example, in the case of VgsQ1=−2 V, the maximum drain current flowing through the GaN-FET Q1 when the load short circuit occurs is able to be reduced from Idmax1 to Idmax as illustrated in FIG. 2.

As indicated also with the mathematical expression (3) above, the drain current Id flowing through the GaN-FET Q1 decreases when RonQ2 increases as described above.

In a case where the gate voltage Vgs of the composite semiconductor device 10, that is, the gate voltage VgsQ2 of the Si-FET Q2 is high and a lot of drain currents Id can flow through the composite semiconductor device 10, the on-resistance RonQ2 of the Si-FET Q2 increases when the load short circuit occurs, and the reverse voltage corresponding to the voltage drop in the Si-FET Q2 is applied to the GaN-FET Q1. Thereby, the drain current Id flowing through the GaN-FET Q1 is limited to the maximum drain current Idmax. As a result, the drain current Id flowing through the composite semiconductor device 10 is limited to the maximum drain current Idmax as illustrated in FIG. 3.

Note that, the on-resistance Ron of the composite semiconductor device 10 is a sum of the on-resistance RonQ1 of the GaN-FET Q1 and the on-resistance RonQ2 of the Si-FET Q2.

$$Ron=RonQ1+RonQ2$$

Thus, when the on-resistance RonQ2 of the Si-FET Q2 excessively increases, the on-resistance Ron of the composite semiconductor device 10 excessively increases. It is important to limit the drain current Id to the maximum drain current Idmax in a range where a relational expression described below is satisfied so that a merit of the low on-resistance of the GaN-FET Q1 is utilized and the GaN-FET Q1 is not broken when the load short circuit occurs.

(ii) About limitation of maximum drain current Idmax by decreasing absolute value of threshold voltage VTHQ1 of GaN-FET Q1

When the load short circuit occurs, the power supply voltage is applied to the GaN-FET Q1, and the voltage of Vds=400 V is applied, for example, as the drain-source voltage Vds. At this time, the drain current Id flowing through the GaN-FET Q1 is in the saturated state. When the gate voltage VgsQ1 of the GaN-FET Q1 is, for example, 0 V, the current value of the saturated drain current Id flowing through the GaN-FET Q1 depends on a value of the absolute value of the threshold voltage VTHQ1 of the GaN-FET Q1. That is, since the threshold voltage VTHQ1 of the GaN-FET Q1 has a negative value, as the threshold voltage VTHQ1 increases, in other words, as the absolute value of the threshold voltage VTHQ1 decreases, the current value of the saturated drain current Id flowing through the GaN-FET Q1 is reduced.

In this manner, as indicated also with the mathematical expression (3) above, the drain current Id is reduced when the absolute value of the threshold voltage VTHQ1 decreases.

As described above, even when the voltage of Vds=400 V is applied, for example, as the drain-source voltage Vds due to the load short circuit, by setting the on-resistance RonQ2 of the Si-FET Q2 and the absolute value of the threshold voltage VTHQ1 of the GaN-FET Q1 to satisfy a relation described below, the composite semiconductor device 10 is able to resist the load short circuit without breakdown for at least 2 μsec, preferably, 5 μsec. As a result, the control circuit 2 is able to cut off the path through which the drain current Id flows before the GaN-FET Q1 is broken when the load short circuit occurs.

(iii) About relation satisfied by on-resistance RonQ2 of Si-FET Q2 and absolute value of threshold voltage VTHQ1 of GaN-FET Q1

A relation satisfied by the on-resistance RonQ2 of the Si-FET Q2 and the absolute value of the threshold voltage VTHQ1 of the GaN-FET Q1 in the composite semiconductor device 10 of the present embodiment will be described in detail below.

Description will be given below for a case where the voltage applied to the GaN-FET Q1 is 400 V.

In the GaN-FET Q1, a relation of Vg-Id in the saturated state is linearly approximated as indicated in the following mathematical expression (4).

$$\text{Idmax1} = gm^* |\text{VTH}Q1| \qquad (4)$$

By substituting the mathematical expression (4) into the mathematical expression (3) above and transforming the formula, the following mathematical expression (5) is obtained.

$$\text{Idmax} = \text{Idmax1}/(1 + gm/\text{Ron}Q2)$$

$$\leftrightarrow \text{Idmax} = \text{Idmax1}/(1 + (\text{Idmax1}/|\text{VTH}Q1|)^*\text{Ron}Q2) \qquad (5)$$

By transforming the mathematical expression (5) above, the following mathematical expression (6) is derived.

[Math. 2]

$$\frac{\text{Ron}Q2}{|\text{VTH}Q1|} + \frac{1}{\text{Idmax1}} \geq \frac{1}{\text{Idmax}} \qquad (6)$$

According to the mathematical expression (6) above, when Idmax is reduced to be equal to or smaller than a certain value Idx, RonQ2, VTHQ1, and Idmax1 satisfy the following relational expression (7).

[Math. 3]

$$\frac{\text{Ron}Q2}{|\text{VTH}Q1|} + \frac{1}{\text{Idmax1}} \geq \frac{1}{\text{Idx}} \qquad (7)$$

Here, the maximum drain current Idmax1 at the overcurrent in the GaN-FET Q1 can have various values depending on device characteristics of the GaN-FET Q1. It may be a problem if the maximum drain current Idmax1 at the overcurrent of the GaN-FET Q1 has such a current value among the values that may cause breakdown of the GaN-FET Q1. In the composite semiconductor device 10 of the present embodiment, in a case where the maximum drain current Idmax1 at the overcurrent of the GaN-FET Q1 has such a current value that may cause breakdown of the GaN-FET Q1, when the relation of the mathematical expression (7) above is satisfied, the drain current Id flowing through the composite semiconductor device 10 is able to be limited to the maximum drain current Idmax and the GaN-FET Q1 is able to be prevented from being broken for a certain time.

For example, when the maximum drain current Idmax1 at the overcurrent in the GaN-FET Q1 is 250 A, a relation of the on-resistance RonQ2 of the Si-FET Q2, the threshold VTHQ1 of the GaN-FET Q1, and the maximum drain current Idmax flowing through the composite semiconductor device 10 is only required to satisfy the relation of the expression (6) above. The resulting relation between the maximum drain current Idmax flowing through the composite semiconductor device 10 and the on-resistance RonQ2 of the Si-FET Q2 at each of the threshold voltages VTHQ1 of the GaN-FET Q1 of the composite semiconductor device 10 is illustrated in FIG. 4.

Figures 4, 5:
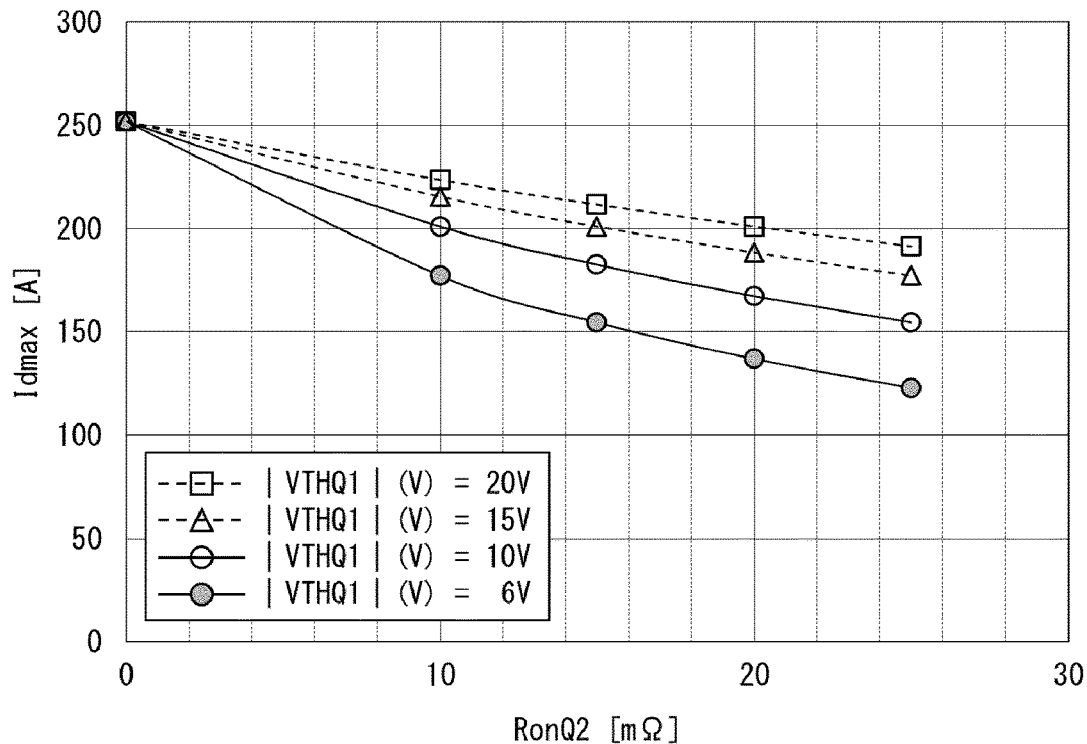
FIG. 4 is a graph indicating a relation between a maximum drain current flowing through the composite semiconductor device and an on-resistance of a Si-FET at each threshold voltage of the GaN-FET of the composite semiconductor device.
FIG. 5 is a table indicating a maximum drain current during overcurrent of the GaN-FET, each short circuit breakdown time, and a maximum drain current flowing through the composite semiconductor device in a case where a load connected to the composite semiconductor device is short-circuited, and conditions to be satisfied by the on-resistance of the Si-FET and the threshold voltage of the GaN-FET that are obtained from the maximum drain current during overcurrent, the short circuit breakdown time, and the maximum drain current flowing through the composite semiconductor device.

As illustrated in FIG. 4, when an allowable maximum current value of the GaN-FET Q1 is 200 A, for example, the on-resistance RonQ2 of the Si-FET Q2 and the threshold VTHQ1 of the GaN-FET Q1 may be set so that the maximum drain current Idmax<200 A is satisfied. In other words, the maximum drain current Idmax in the composite semiconductor device 10 of the present embodiment is equal to or smaller than the allowable maximum current value of the GaN-FET Q1. The allowable maximum current value varies in accordance with a specific specification of the GaN-FET Q1 and a length of time requested as a resistance time up to when the GaN-FET Q1 is broken after the load short circuit as described below. That is, the allowable maximum current value means such a current value that the GaN-FET Q1 is not broken or does not have deteriorated characteristics for a desired certain time, specifically, for example, 2 μsec as described below.

Specific description of the relation between the on-resistance RonQ2 of the Si-FET Q2 and the threshold VTHQ1 of the GaN-FET Q1 in the composite semiconductor device 10 of the present embodiment will be given below in more detail with reference to FIGS. 5 and 6.

As described above, the maximum drain current Idmax1 at the overcurrent flowing through the GaN-FET Q1 when the load short circuit occurs can have various values depending on device characteristics of the GaN-FET Q1. Here, for example, a case where the voltage applied to the GaN-FET Q1 is fixed to 400 V will be described. In this case, the voltage actually applied to the GaN-FET Q1 can naturally have various voltage values in accordance with a configuration of a circuit in which the composite semiconductor device 10 of the present embodiment is incorporated. Regardless of the composite semiconductor device 10 of the present embodiment being incorporated in any circuit, a relational expression described below is satisfied while the voltage of 400 V is applied to the GaN-FET Q1.

As described above, the maximum drain current Idmax1 at the overcurrent flowing through the GaN-FET Q1 when the load short circuit occurs can have various values. The allowable maximum current value obtained as the maximum drain current Idmax that limits the drain current Id flowing through the GaN-FET Q1 when the load short circuit occurs varies in accordance with a value of the maximum drain current Idmax1 at the overcurrent and a length of time requested as a resistance time up to when the GaN-FET Q1 is broken after the load short circuit.

That is, a maximum drain current Idmax to be limited is obtained on the basis of the value of the maximum drain current Idmax1 at the overcurrent and the length of time requested as a resistance time up to when the GaN-FET Q1 is broken after the load short circuit. Conditions to be satisfied by the on-resistance RonQ2 of the Si-FET Q2 and the threshold voltage VTHQ1 of the GaN-FET in order to limit the maximum drain current Idmax1 at the overcurrent to the maximum drain current Idmax are decided on the basis of the mathematical expression (6) above. This will be described below with reference to FIGS. 5 and 6.

FIG. 5 is a table indicating the maximum drain current Idmax1 at the overcurrent of the GaN-FET Q1, each short circuit breakdown time Tp, and the limited maximum drain current Idmax flowing through the composite semiconductor device 10 in a case where the load connected to the composite semiconductor device 10 is short-circuited, and conditions to be satisfied by the on-resistance RonQ2 of the Si-FET Q2 and the threshold voltage VTHQ1 of the GaN-FET that are obtained from the maximum drain current Idmax1, the short circuit breakdown time Tp, and the limited maximum drain current Idmax.

Here, the short circuit breakdown time Tp is time as described below. That is, in the composite semiconductor device 10, even when the voltage of 400 V is applied to the GaN-FET Q1 due to the load short circuit, the GaN-FET Q1 is required to resist the load short circuit without breakdown for a certain time. A time elapsed after the time at which the load is short-circuited is set as a time elapsed after short circuit T and a time until the GaN-FET Q1 is broken when a certain maximum drain current Idmax flows is set as the short circuit breakdown time Tp. In other words, the short circuit breakdown time Tp means a time during which the GaN-FET Q1 resists the load short circuit without breakdown.

In FIG. 5, each maximum drain current Idmax of the composite semiconductor device 10 is decided in accordance with the short circuit breakdown time Tp as described below. When the maximum drain current Idmax decided in accordance with the short circuit breakdown time Tp is set as an allowable maximum current value, by substituting a value of the maximum drain current Idmax1 at the overcurrent and the allowable maximum current value into the expression (6) above, conditions to be satisfied by the on-resistance RonQ2 of the Si-FET Q2 and the threshold voltage VTHQ1 of the GaN-FET Q1 are decided. In other words, in the composite semiconductor device 10 of the present embodiment, when the on-resistance RonQ2 of the Si-FET Q2 and the threshold voltage VTHQ1 of the GaN-FET Q1 satisfy the relation of the expression (6) under various conditions, the GaN-FET Q1 is able to resist the load short circuit without breakdown for a desired time elapsed after short circuit T after the load is short-circuited.

The decision of each maximum drain current Idmax of the composite semiconductor device 10 based on the desired short circuit breakdown time Tp in FIG. 5 will be described below with reference to FIG. 6.

Figure 6:
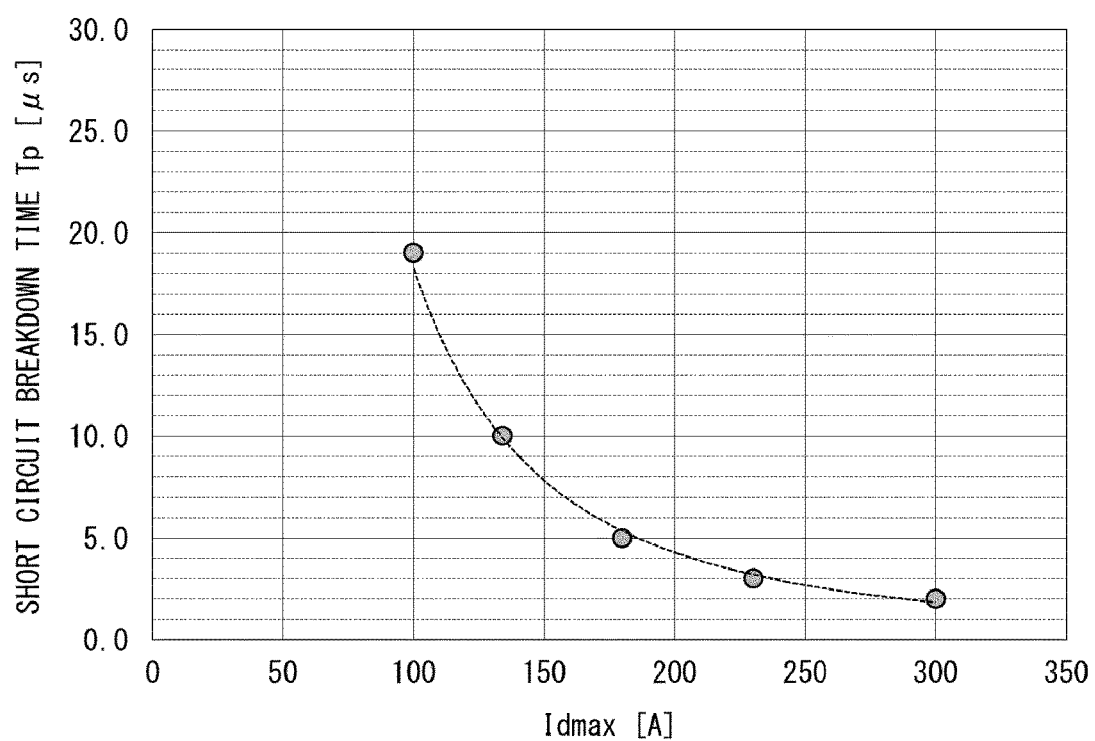
FIG. 6 is a graph indicating a relation between a maximum drain current flowing through the composite semiconductor device and a time up to when the GaN-FET is broken after the maximum drain current starts to flow.

FIG. 6 is a graph indicating a relation between the maximum drain current Idmax flowing through the composite semiconductor device 10 and a time up to when the GaN-FET Q1 is broken after the maximum drain current Idmax starts to flow.

As illustrated in FIG. 6, as the maximum drain current Idmax increases, the short circuit breakdown time Tp is reduced. In order to set the short circuit breakdown time Tp as 2 μsec, the maximum drain current Idmax may be 300 A. In order to set the short circuit breakdown time Tp as 3 μsec, the maximum drain current Idmax may be 230 A. In order to set the short circuit breakdown time Tp as 5 μsec, the maximum drain current Idmax may be 180 A.

Though the short circuit breakdown time Tp is set as at least 2 μsec or more in the composite semiconductor device 10 of the present embodiment, the short circuit breakdown time Tp required for the composite semiconductor device 10 can depend on characteristics required for the composite semiconductor device 10. For example, reduction of possibility that the GaN-FET Q1 is broken when the load short circuit occurs is a matter of importance (hereinafter, expressed as importance on resistance), the short circuit breakdown time Tp is preferably 5 μsec or more. When reducing the on-resistance Ron of the composite semiconductor device 10 as much as possible while preventing breakdown of the GaN-FET Q1 when the load short circuit occurs is a matter of importance (hereinafter, expressed as importance on Ron), the short circuit breakdown time Tp is preferably 3 μsec or more.

The maximum drain current Idmax1 at the overcurrent in the GaN-FET Q1 can have various values, and may be, for example, 250 A, 300 A, or 350 A or may of course have other current values. Here, as an example of an action of limiting the drain current Id flowing through the composite semiconductor device 10 when the load short circuit occurs in the composite semiconductor device 10 of the present embodiment, a case where the voltage applied to the GaN-FET Q1 is 400 V and the maximum drain current Idmax1 at the overcurrent in the GaN-FET Q1 is 250 A will be described.

As illustrated in FIG. 5, in the case of the importance on resistance, that is, when the short circuit breakdown time Tp is 5 μsec or more, a relation of the following mathematical expression (8) may be satisfied with the mathematical expression (6) and the maximum drain current Idmax of 180 A.

[Math. 4]

$$\frac{RonQ2}{|VTHQ1|} \geq \frac{7}{4500} \quad (8)$$

As clear from the mathematical expression (8) above, the on-resistance RonQ2 of the Si-FET Q2 and the threshold voltage VTHQ1 of the GaN-FET Q1 have a trade-off relation. For example, in the case of $|VTHQ1|=6$ V, $RonQ2 \geq 9.4$ mΩ may be provided, in the case of $|VTHQ1|=10$ V, $RonQ2 \geq 15.6$ mΩ may be provided, and in the case of $|VTHQ1|=20$ V, $RonQ2 \geq 31.2$ mΩ may be provided.

On the other hand, in the case of the importance on Ron, that is, when the short circuit breakdown time Tp is 3 µsec or more, a relation of the following mathematical expression (9) may be satisfied with the maximum drain current Idmax of 230 A in the mathematical expression (6) above.

[Math. 5]

$$\frac{RonQ2}{|VTHQ1|} \geq \frac{1}{2875} \qquad (9)$$

For example, in the case of |VTHQ1|=6 V, RonQ2≥2.1 mΩ may be provided, in the case of |VTHQ1|=10 V, RonQ2≥3.5 mΩ may be provided, and in the case of |VTHQ1|=20 V, RonQ2≥7.0 mΩ may be provided.

In the aforementioned relation, the threshold voltage VTHQ1 of the GaN-FET Q1 preferably satisfies |VTHQ1|=20 V. Thereby, it is not necessary to significantly increase the on-resistance RonQ2 of the Si-FET Q2.

In order to utilize a merit of the low on-resistance of the GaN-FET Q1, the on-resistance Ron of the entire composite semiconductor device 10 is required to be reduced as much as possible. Thus, the on-resistance Ron of the entire composite semiconductor device 10 is preferably 60 mΩ or less.

Therefore, the threshold voltage VTHQ1 of the GaN-FET Q1 preferably satisfies |VTHQ1|≤10 V. Here, in the present embodiment, the on-resistance RonQ1 of the GaN-FET Q1 is, for example, approximately 31 mΩ.

In the case of the importance on the on-resistance, according to the aforementioned relational expression, it is only required that RonQ2≥3.5 mΩ is satisfied, and in this case, Ron≥35 mΩ is given.

In the case of the importance on short circuit, according to the aforementioned relational expression, it is only required that RonQ2≥15.6 mΩ is satisfied, and in this case, Ron≥47 mΩ is provided. Here, in the case of |VTHQ1|=20 V, RonQ2≥31.2 mΩ and Ron≥63 mΩ are given.

Here, as described above, the case where the maximum drain current Idmax1 at the overcurrent in the GaN-FET Q1 is 250 A has been described as an example. However, the current value of the maximum drain current Idmax1 at the overcurrent in the GaN-FET Q1 may be, for example, 300 A, 350 A, or other current values. In each of the current values, the relation as indicated in FIG. 6 is able to be obtained, and the maximum drain current Idmax that achieves a desired short circuit breakdown time is able to be obtained on the basis of the relation. The composite semiconductor device 10 of the present embodiment has the on-resistance RonQ2 of the Si-FET Q2 and the threshold voltage VTHQ1 of the GaN-FET Q1 that satisfy the relation of the relational expression (6) above.

The control for the on-resistance Ron as described above is able to be performed, for example, by increasing a drift resistance, increasing a junction resistance, or the like, and may be performed by using another method.

As a conventional Si-FET, a super junction MOSFET can be used to achieve a low on-resistance. On the other hand, as the Si-FET Q2 in the present embodiment, a planar or trench SiMOSFET may be used because a low on-resistance is not pursued, thus making it possible to reduce manufacturing cost.

Embodiment 2

Another embodiment of the invention will be described below with reference to FIG. 7. Note that, the present embodiment is identical to Embodiment 1 above except for those components described below. For convenience of description, members having the same functions as those of the members illustrated in the drawing of Embodiment 1 above are given the same reference signs and description thereof will be omitted.

In Embodiment 1 above, the circuit configuration of the composite semiconductor device 10 which includes the normally-on GaN-FET Q1 and the normally-off Si-FET Q2 and in which the maximum drain current of the GaN-FET Q1 is limited by the on-resistance RonQ2 of the Si-FET Q2 has been described. In the present embodiment, a specific configuration of a composite semiconductor device in which the GaN-FET Q1 and the Si-FET Q2 are mounted in one TO (Transistor Outline) package will be described.

A composite semiconductor device 100 of the present embodiment will be described with reference to FIG. 7. FIG. 7(a) is a top view illustrating a specific configuration of the composite semiconductor device according to the present embodiment and FIG. 7(b) is a side view.

The composite semiconductor device 100 according to the present embodiment includes, as illustrated in FIG. 7(a), a normally-on field effect transistor 101 (hereinafter, simply referred to as a transistor 101), a normally-off field effect transistor 102 (hereinafter, simply referred to as a transistor 102), a first terminal 103 (drain terminal), a second terminal 104 (gate terminal), a die pad 106 that functions as a source terminal of the composite semiconductor device 100, and a sealing member 107. The transistor 101 is constituted by, for example, the GaN-FET Q1 and has higher breakdown voltage than that of the transistor 102. The transistor 102 is, for example, the Si-FET Q2. The die pad 106 is only required to be made of an electrically-conductive material and is not limited in other conditions. The sealing member 107 is made of, for example, resin.

The composite semiconductor device 100 has the transistor 101 and the transistor 102 cascode-connected to each other as illustrated in FIG. 7(a). The transistor 101 and the transistor 102 are arranged on the die pad 106. The transistor 101 and the transistor 102 are sealed by the sealing member 107.

As illustrated in FIG. 7(b), each of the die pad 106, the transistor 101, and the transistor 102 has a first main surface and a second main surface. Hereinafter, an upper surface and a lower surface of the transistor 101 are respectively called a first main surface S1 and a second main surface S4. An upper surface and a lower surface of the transistor 102 are respectively called a first main surface S2 and a second main surface S5. An upper surface and a lower surface of the die pad 106 are respectively called a first main surface S3 and a second main surface S6.

As illustrated in FIGS. 7(a) and (b), the transistor 101 has a lateral structure, and has a gate electrode 110, a drain electrode 111, and a source electrode 112 arranged on the first main surface S1. No electrode is formed on the second main surface S4. Note that, the transistor 101 may have a configuration in which an electrode is formed on the second main surface S4 and mounting is performed by using solder for the electrode in consideration of heat dissipation.

The transistor 102 has a lateral structure, has a source electrode as a back electrode, and apparently has a vertical structure. Alternatively, the transistor 102 has a vertical structure. A gate electrode 120 and a drain electrode 121 are arranged on the first main surface S2. A not-illustrated source electrode 122 is arranged on the second main surface S5 of the transistor 102. The source electrode 122 does not depart from the purpose of the invention regardless of whether a whole or a part of a back surface of the transistor 102 serves as the source electrode 122.

A part of the first main surface S3 of the die pad 106 also serves as a third terminal 105 of the composite semiconductor device 100.

The source electrode 112 arranged on the first main surface S1 of the transistor 101 and the drain electrode 121 arranged on the first main surface S2 of the transistor 102 are electrically connected to each other by an electric conductor 113. The drain electrode 111 arranged on the first main surface S1 of the transistor 101 and the first terminal 103 are electrically connected to each other by an electric conductor 114.

The gate electrode 120 arranged on the first main surface S2 of the transistor 102 and the second terminal 104 are electrically connected to each other by an electrically-conductive member 116. The gate electrode 110 arranged on the first main surface S1 of the transistor 101 and the first main surface S3 of the die pad 106 are electrically connected to each other by an electrically-conductive member 115. The source electrode 122 arranged on the second main surface S5 of the transistor 102 and the first main surface S3 of the die pad 106 are electrically connected to each other.

In the composite semiconductor device 100, as illustrated in FIG. 7(b), the first main surface S3 of the die pad 106 and the second main surface S5 of the transistor 102 are in face-to-face contact with each other. Further, the first main surface S3 of the die pad 106 and the second main surface S4 of the transistor 101 are in face-to-face contact with each other.

The second main surface S4 of the transistor 101 is die-bonded onto the first main surface S3 of the die pad 106 with a thermally-conductive die bonding material. The thermal conductivity of the die bonding material allows heat generated in the transistor 101 to be dissipated into the die pad 106. Note that, since the transistor 101 and the die pad 106 do not need to be electrically connected to each other, the die bonding material does not need to have electrical conductivity. The second main surface S5 of the transistor 102 is die-bonded onto the first main surface S3 of the die pad 106 with solder or the like. The solder functions to die-bond the transistor 102 to the die pad 106 and electrically connect the transistor 102 and the die pad 106 to each other. Note that, an electrically-conductive paste having high die bonding performance may be used instead of the solder.

In the composite semiconductor device 100 according to the present embodiment, the GaN-FET Q1 (transistor 101) and the Si-FET Q2 (transistor 102) are arranged on the same lead frame. The gate electrode 110 of the transistor 101 is connected to the source electrode 122 of the transistor 102 and the third terminal 105 and is at the same potential as those of the source electrode 122 and the third terminal 105.

Thus, when a load is connected to the third terminal 105 of the composite semiconductor device 100, the Si-FET Q2 is in the ON state, and the drain current Id flows, a reverse voltage of the drain-source voltage of the Si-FET Q2 is applied as the gate voltage of the GaN-FET Q1 when the load short circuit occurs. Here, in the composite semiconductor device 100 according to the present embodiment, as the on-resistance RonQ2 of the Si-FET Q2 increases, the maximum drain current flowing thorough the GaN-FET Q1 is limited to an extent that breakdown of the GaN-FET Q1 is prevented. Alternatively, as the absolute value of the threshold voltage VTHQ1 of the GaN-FET Q1 decreases, a difference between the gate voltage VgsQ1 and the threshold voltage VTHQ1 in the GaN-FET Q1 is reduced, so that the maximum drain current Idmax is limited.

As a result, it is possible to obtain the composite semiconductor device that has a low on-resistance and a high load-short-circuit resistance.

The composite semiconductor device 100 of the present embodiment has a configuration in which the die pad 106 functions as the source terminal and both the transistors 101 and 102 are mounted on the die pad 106 serving as a source frame.

Embodiment 3

Another embodiment of the invention will be described below with reference to FIG. 8. Note that, the present embodiment is identical to Embodiment 1 above except for those components described below. For convenience of description, members having the same functions as those of the members illustrated in the drawing of Embodiment 1 above are given the same reference signs and description thereof will be omitted.

The specific configuration of the composite semiconductor device 100 in which the GaN-FET Q1 and the Si-FET Q2 are mounted in one TO package has been described in Embodiment 2 above. In the present embodiment, an inverter bridge circuit 200 obtained by applying the composite semiconductor device 100 will be described.

The inverter bridge circuit 200 of the present embodiment will be described with reference to FIG. 8. FIG. 8 is a circuit diagram illustrating a specific configuration of the inverter bridge circuit 200 to which the composite semiconductor device 100 according to the present embodiment is applied.

Figure 8:
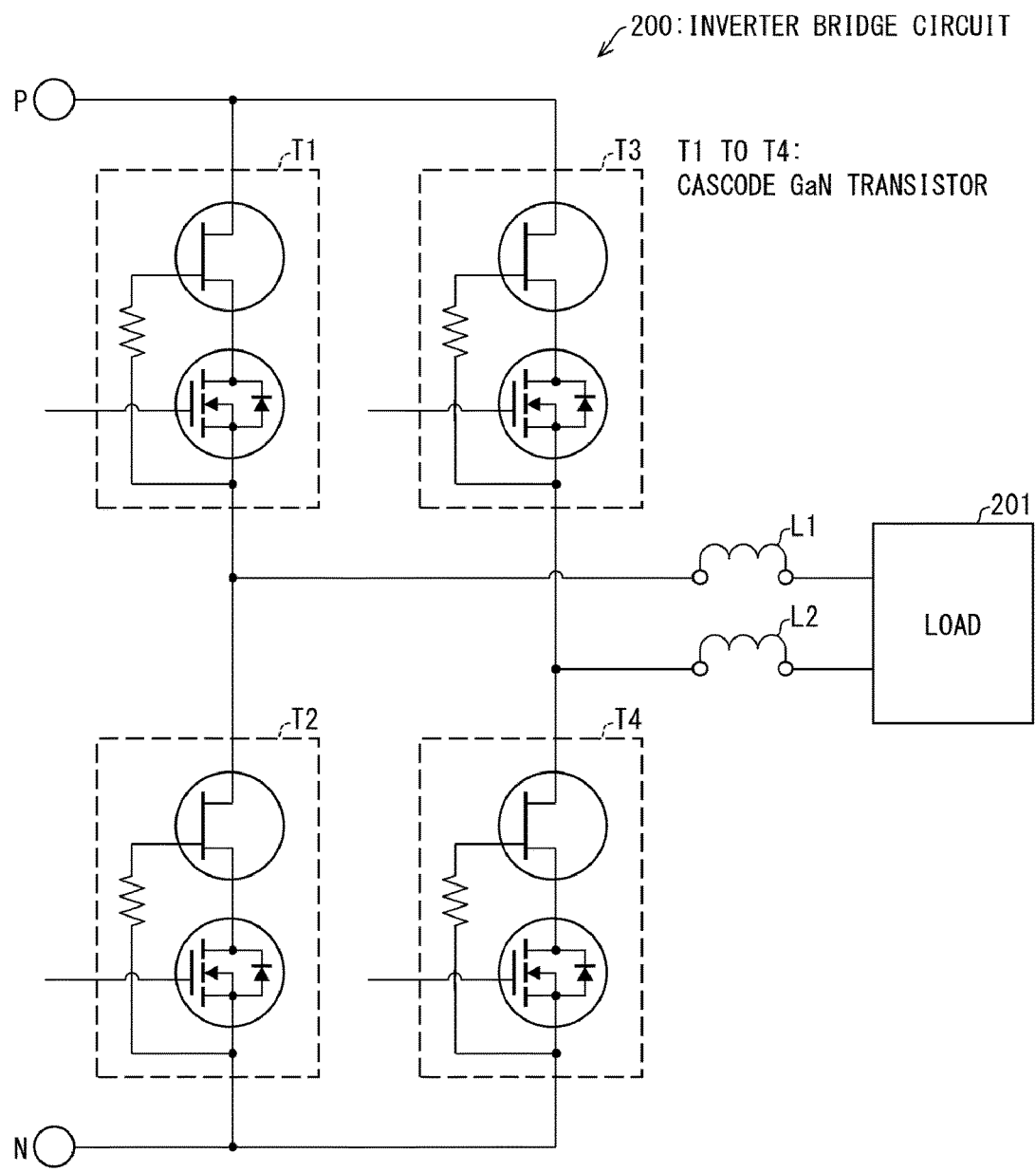
FIG. 8 is a circuit diagram illustrating a specific configuration of an inverter bridge circuit to which a composite semiconductor device according to Embodiment 3 of the invention is applied.

As illustrated in FIG. 8, the inverter bridge circuit 200 according to the present embodiment has a positive electrode P having a positive potential, a negative electrode N having a potential lower than that of the positive electrode P, four cascode GaN transistors T1 to T4 that are connected between the positive electrode P and the negative electrode N, a load 201 that is connected to the cascode GaN transistors T1 to T4, and two coils L1 and L2 that are connected to the load 201.

The composite semiconductor device 100 is used for each of the cascode GaN transistors T1 to T4. That is, the GaN-FET Q1 and the Si-FET Q2 are provided in a cascode configuration inside each of the cascode GaN transistors T1 to T4. The gate voltage of the Si-FET Q2 of each of the cascode GaN transistors T1 to T4 is controlled by a not-illustrated control device, so that the ON state and the OFF state of each of the cascode GaN transistors T1 to T4 are controlled.

The load 201 is connected to the cascode GaN transistors T1 and T2 via the coil L1 and connected to the cascode GaN transistors T3 and T4 via the coil L2. The positive electrode P is connected to the cascode GaN transistors T1 and T3 and the negative electrode N is connected to the cascode GaN transistors T2 and T4.

The inverter bridge circuit 200 converts a direct current into an alternating current by controlling each of the cascode GaN transistors T1 to T4. Such an inverter bridge circuit 200 is required to resist load short circuit due to an excessive load, an erroneous operation, or the like.

The inverter bridge circuit 200 of the present embodiment highly resists the load short circuit by using the composite semiconductor device 100 for each of the cascode GaN transistors T1 to T4.

That is, in the case of the load short circuit of the inverter bridge circuit 200, a high Vds is applied to a cascode GaN transistor that is in the ON state among the cascode GaN transistors T1 to T4 and the drain current Id reaches a saturated region. At this time, as the on-resistance of the Si-FET Q2 forming each of the cascode GaN transistors T1 to T4 becomes high, the gate voltage VgsQ1 of the GaN-FET Q1 is reduced and the maximum drain current Idmax is limited accordingly. Alternatively, as the absolute value of the threshold voltage VTHQ1 of the GaN-FET Q1 becomes low, a difference between the gate voltage VgsQ1 and the threshold voltage VTHQ1 in the GaN-FET Q1 is reduced, so that the maximum drain current Idmax is limited.

As a result, it is possible to prevent breakdown of the GaN-FET Q1 when overcurrent flows.

CONCLUSION

In a composite semiconductor device according to an aspect 1 of the invention including a normally-on first FET (GaN-FET Q1) and a normally-off second FET (Si-FET Q2) that are cascode-connected to each other, in a case where a voltage applied to a drain of the first FET is 400 V, a relation of a following expression is satisfied:

[Math. 6]

$$\frac{RonQ2}{|VTHQ1|} + \frac{1}{Idmax1} \geq \frac{1}{Idmax},$$

where a time elapsed after short circuit T represents a time elapsed after a time at which a load connected to the composite semiconductor device starts to be short-circuited, RonQ2 represents a value of an on-resistance of the second FET, VTHQ1 represents a threshold voltage of the first FET, Idmax1 represents a drain current of the first FET in a saturated state of the first FET when a gate voltage of the first FET is 0 V, and Idmax represents a drain current limited to an extent that breakdown of the first FET is prevented for the time elapsed after short circuit T of at least 2 μsec.

According to the aforementioned configuration, the on-resistance of the second FET and the threshold voltage of the first FET satisfy the relational expression above. Thus, when the on-resistance of the second FET is slightly high and the load connected to the composite semiconductor device is short-circuited, a voltage drop in the second FET further increases and a reverse voltage corresponding to the voltage drop is applied as a gate voltage to the first FET, and thus a maximum drain current of the first FET is able to be limited. Alternatively, when an absolute value of the threshold voltage of the first FET is slightly reduced and the load connected to the composite semiconductor device is short-circuited, a difference between the gate voltage of the first FET and the threshold voltage of the first FET is small, and thus the maximum drain current of the first FET is able to be limited. As a result, it is possible to prevent breakdown of the first FET for the time elapsed after short circuit T of at least 2 μsec when the load short circuit occurs. In addition, even when the on-resistance of the second FET is slightly high, an on-resistance of the entire composite semiconductor device does not need to be increased to an extent that an advantage of the low on-resistance in the composite semiconductor device is deteriorated. Accordingly, it is possible to provide the composite semiconductor device that has a low on-resistance and a high load-short-circuit resistance.

The composite semiconductor device according to an aspect 2 of the invention satisfies a following expression in the aspect 1:

[Math. 7]

$$\frac{RonQ2}{|VTHQ1|} \geq \frac{1}{2875}.$$

According to the aforementioned configuration, in the aspect 1, a short circuit breakdown time Tp represents a time until the first FET is broken after the load is short-circuited when a certain maximum drain current Idmax flows, and when a maximum drain current Idmax1 at the overcurrent of the first FET is 250 A, the maximum drain current Idmax is able to be made smaller than 230 A and the short circuit breakdown time Tp is able to be set as 3 μsec or more.

The composite semiconductor device according to an aspect 3 of the invention satisfies a following expression in the aspect 1:

[Math. 8]

$$\frac{RonQ2}{|VTHQ1|} \geq \frac{7}{4500}.$$

According to the aforementioned configuration, in the aspect 1, when the maximum drain current Idmax1 at the overcurrent of the first FET is 250 A, the maximum drain current Idmax is able to be made smaller than 180 A and the short circuit breakdown time Tp is able to be set as 5 μsec or more.

The composite semiconductor device according to an aspect 4 of the invention satisfies |VTHQ1|≤20 V in any of the aspects 1 to 3.

According to the aforementioned configuration, the on-resistance RonQ2 of the second FET for satisfying the relational expression above does not need to be excessively increased.

In the composite semiconductor device according to an aspect 5 of the invention, a value of the on-resistance RonQ2 is 7.0 mΩ or more in the aspect 4.

According to the aforementioned configuration, when the maximum drain current Idmax1 at the overcurrent of the first FET is 250 A, the short circuit breakdown time Tp is able to be set as 3 μsec or more.

In the composite semiconductor device according to an aspect 6 of the invention, a value of the on-resistance RonQ2 is 31.2 mΩ or more in the aspect 4.

According to the aforementioned configuration, when the maximum drain current Idmax1 at the overcurrent of the first FET is 250 A, the short circuit breakdown time Tp is able to be set as 5 μsec or more.

In the composite semiconductor device according to an aspect 7 of the invention, the threshold voltage VTHQ1 satisfies |VTHQ1|≤10 V in any of the aspects 1 to 3.

According to the aforementioned configuration, the on-resistance RonQ2 of the second FET does not need to be excessively increased. Thus, the on-resistance of the entire composite semiconductor device is able to be easily set as 60 mΩ or less.

In the composite semiconductor device according to an aspect 8 of the invention, a value of the on-resistance RonQ2 is 3.5 mΩ or more in the aspect 7.

According to the aforementioned configuration, when the on-resistance RonQ1 of the GaN-FET Q1 is approximately 31 mΩ, the short circuit breakdown time Tp is able to be set as 3 μsec or more when Ron≥35 mΩ is satisfied.

In the composite semiconductor device according to an aspect 9 of the invention, a value of the on-resistance RonQ2 is 15.6 mΩ or more in the aspect 7.

According to the aforementioned configuration, when the on-resistance RonQ1 of the GaN-FET Q1 is approximately 31 mΩ, the short circuit breakdown time Tp is able to be set as 5 μsec or more when Ron≥47 mΩ is satisfied.

In the composite semiconductor device according to an aspect 10 of the invention, the second FET may be formed of an insulated gate FET or a Schottky gate FET in any of the aspects 1 to 9.

According to the aforementioned configuration, as the second FET, a suitable FET may be selected as appropriate in accordance with characteristics required for the composite semiconductor device, and as a result less limitation is imposed on a design of the composite semiconductor device.

In the composite semiconductor device according to an aspect 11 of the invention, the first FET may be formed of a gallium nitride semiconductor in any of the aspects 1 to 10.

According to the aforementioned configuration, it is possible to relatively easily achieve a high withstand voltage, a high-temperature operation, and a low on-resistance by heterojunction. Thus, even when the on-resistance of the second FET is slightly high, the on-resistance of the entire composite semiconductor device does not excessively increase.

In the composite semiconductor device according to an aspect 12 of the invention, the first FET and the second FET may be mounted in one package in any of the aspects 1 to 11.

According to the aforementioned configuration, it is possible to provide a compact composite semiconductor device.

Note that, the invention is not limited to the embodiments described above, and may be modified in various manners within the scope of the claims, and an embodiment achieved by appropriately combining technical means disclosed in different embodiments is also encompassed in the technical scope of the invention.

INDUSTRIAL APPLICABILITY

The invention is able to be used for a composite semiconductor device in which a normally-on first field effect transistor (FET) and a normally-off second FET are cascode-connected to each other. In particular, the invention is able to be used for a composite semiconductor device in which a GaN-FET and a Si-FET are cascode-connected to each other.

REFERENCE SIGNS LIST 1 voltage source
2 control circuit
3 load
10, 100 composite semiconductor device
Id drain current
Q1 GaN-FET (first FET)
Q2 Si-FET (second FET)
Ron on-resistance of entire composite semiconductor device
RonQ1 on-resistance of GaN-FET
RonQ2 on-resistance of Si-FET
VTHQ1, VTHQ2 threshold voltage

The invention claimed is:

1. A composite semiconductor device comprising a normally-on first FET and a normally-off second FET that are cascode-connected to each other, wherein
in a case where a voltage applied to a drain of the first FET is 400 V,
a relation of a following expression is satisfied:

$$\frac{RonQ2}{|VTHQ1|} + \frac{1}{Id\text{max}1} \geq \frac{1}{Id\text{max}},$$

where a time elapsed after short circuit T represents a time elapsed after a time at which a load connected to the composite semiconductor device starts to be short-circuited,
RonQ2 represents a value of an on-resistance of the second FET, VTHQ1 represents a threshold voltage of the first FET, Idmax1 represents a drain current of the first FET in a saturated state of the first FET when a gate voltage of the first FET is 0 V, and
Idmax represents a drain current limited to an extent that breakdown of the first FET is prevented for the time elapsed after short circuit T of at least 2 μsec.

2. The composite semiconductor device according to claim 1, wherein a relation of a following expression is satisfied:

$$\frac{RonQ2}{|VTHQ1|} \geq \frac{1}{2875}.$$

3. The composite semiconductor device according to claim 1, wherein a relation of a following expression is satisfied:

$$\frac{RonQ2}{|VTHQ1|} \geq \frac{7}{4500}.$$

4. The composite semiconductor device according to claim 1, wherein the threshold voltage VTHQ1 satisfies |VTHQ1|≤20 V.

5. The composite semiconductor device according to claim 1, wherein the threshold voltage VTHQ1 satisfies |VTHQ1|≤10 V.

* * * * *